United States Patent [19]

Zeh

[11] Patent Number: 4,771,230
[45] Date of Patent: Sep. 13, 1988

[54] ELECTRO-LUMINESCENT METHOD AND TESTING SYSTEM FOR UNPOPULATED PRINTED CIRCUIT BOARDS, CERAMIC SUBSTRATES, AND THE LIKE HAVING BOTH ELECTRICAL AND ELECTRO-OPTICAL READ-OUT

[75] Inventor: Robert M. Zeh, East Berne, N.Y.
[73] Assignee: Testamatic Corporation, Scotia, N.Y.
[21] Appl. No.: 914,308
[22] Filed: Oct. 2, 1986
[51] Int. Cl.[4] ............................................. G01R 31/02
[52] U.S. Cl. ........................... 324/73 PC; 250/484.1; 324/158 F
[58] Field of Search ................ 324/51, 52, 54, 73 PC, 324/73 R, 72.5, 158 R, 158 F, 115, 990 R, 116, 123 R; 250/484.1 R; 365/116; 361/225, 230, 231

[56] References Cited

U.S. PATENT DOCUMENTS

| | | | |
|---|---|---|---|
| 3,044,007 | 7/1962 | Akers | 324/73 R |
| 3,436,651 | 4/1969 | Helms et al. | 324/96 |
| 3,559,190 | 1/1971 | Bitzer et al. | 365/116 |
| 3,991,302 | 11/1976 | Danner | 324/73 PC |
| 4,104,696 | 8/1978 | Cochran, Jr. | 361/231 |
| 4,335,420 | 6/1982 | Mitsuo et al. | 361/230 |
| 4,507,605 | 3/1985 | Geisel | 324/73 PC |
| 4,527,119 | 7/1985 | Rogers et al. | 324/158 F |
| 4,600,878 | 7/1986 | Doemens et al. | 324/51 |

Primary Examiner—Reinhard J. Eisenzopf
Assistant Examiner—W. Burns
Attorney, Agent, or Firm—Charles W. Helzer

[57] ABSTRACT

A method and system for the electrical and electro-optical inspection and testing of unpopulated electronic printed circuit boards, ceramic substrates and other like items which have conductive pathways formed thereon, vias, through-connectors and other interconnected conducting surfaces. The item under test is placed within a sealable gastight chamber filled with an ionizable gaseous atmosphere, such as argon, at low pressure. An electro-luminescent gas plasma discharge is produced within the chamber between a grid placed either over or below the item under test by application of a positive polarity potential to the grid and selective application of a constant current negative potential to particular test points on the item to be tested via a computer controlled movable probe. In one embodiment of the invention, the resulting electro-luminescent gas plasma discharge resistance is measured and compared by a computer to a standard resistance value for the particular item under control at a particular setting of the movable probe as a measure of the conductivity characteristics of the item under test. Other embodiments of the invention, may also include computer controlled electro-optic scanning of the surfaces of the item under test by a scanning photometer detector. The output from the scanning photometer detector is supplied to a computer for comparison to a standard prestored in the computer from a previously tested good board or substrate. The two techniques may be combined in a single system which can inspect either one or both sides of a test circuit board or substrate.

34 Claims, 3 Drawing Sheets fig.1 fig.2 fig.3

ELECTRO-LUMINESCENT METHOD AND TESTING SYSTEM FOR UNPOPULATED PRINTED CIRCUIT BOARDS, CERAMIC SUBSTRATES, AND THE LIKE HAVING BOTH ELECTRICAL AND ELECTRO-OPTICAL READ-OUT

FIELD OF INVENTION

This invention relates to the field of inspection, test and measurement of the quality, shape and/or dimensions of conducting pathways, pads, traces, vias or runs formed on the outer surfaces or an intermediate layer of an unpopulated printed circuit board, ceramic substrate or other like items which contain or include electrically conductive pathways or surfaces. Unpopulated refers to boards which do not contain integrated circuits or capacitors. This instrument will detect and report resistance continuity. More particularly, the invention makes available a new and improved method and apparatus for the automatic inspection, test and measurement of the continuity, existence of shorts and open circuits as well as other conductivity characteristics existing on prefabricated but 7 unpopulated circuit boards, ceramic substrates and other like items.

BACKGROUND OF PRIOR ART PROBLEM

Determining the electrical integrity of complex and high density conductive patterns formed on both the exterior and inner layers of ceramic substrates, printed circuit boards and other like items before populating the substrates and boards with components, has become of increased concern to the electronics industry due to rapidly changing technology and economic considerations. Foremost, PC boards in ever shrinking dimensions, are being designed with increasingly dense patterns to accept surface mounting techniques (SMT) of components. These are in the form of extremely reliable, but expensive, chips, DIP's and EPROM's which reduce the need for after assembly "in-circuit" and "functional circuit" testing, provided the unpopulated boards and substrates are free of defects and leakage paths.

Printed circuit board and substrate designs are changed frequently and the lot size of production runs of these items have decreased, but the variety and varying shapes have increased. In board manufacture, the trend is away from the use of expensive metals which have superior bonding characteristics, such as gold and silver, to the use of less reliable metals such as copper, which has a propensity to cause cracks or "open" conditions. Lastly, the decision "not to test" unpopulated printed circuit boards and substrates can lead to costly scrappage losses after almost error-free component loading under conditions where board continuity failures occur or already existed prior to the mounting of the components.

In the past, test equipment to verify circuit integrity and resistivity of PCBs and substrates used either fixtures of multiple probe (bed-of-nails), spring loaded probe cards, or two programmable probes (flying probes). Another known technique is the use of a single probe or capacitance measurement which requires a second connection to the ground plane. All of these known methods have shortcomings. Multiple probe fixtures and cards are fragile, expensive to build, and cause delays since they have to be specially designed for each PCB or substrate design. Dual probe and capacitance testers exhibit relatively slow test cycles in testing dense patterns on substrates and PC boards. Further, probes can make dents or marks on the metallic conductor pads or points to which they are applied, which can cause component bonding failures and may preclude use of surface mounting techniques. Pressure may cause micro cracks to close. Also, high density printed circuit boards of less than 20 mil pad sizes and spacing often preclude the use of "bed-of-nails" and probe devices due to high cost factors and physical size constraints. Even a more critical limitation to the use of these known test methods is the possibility of failure to detect micro or hair line cracks in both inner and exposed upper of lower layers. An isolation or "open" condition (which occurs where hair line cracks exist) may go undetected by these known systems since they apply an electric potential through the conductors under test. A hair line crack of the order of 1 micron (0.0001 inch) can be bridged by a test voltage as low as 6-10 volts.

To overcome many of these problems, an electro-luminescent gas glow discharge continuity testing system was introduced in the early 1980's by Testamatic Corporation for testing the electrical integrity of unpopulated multi-layer ceramic substrates and printed circuit boards. This electro-luminescent gas discharge continuity testing system is described more fully in U.S. Pat. No. 4,507,605 issued March 26, 1985 for a "Method and Apparatus for Electrical and Optical Inspection and Testing of Unpopulated Printed Circuit Boards and Other Like Items", assigned to Testamatic, Inc. (the assignee of the present invention), the disclosure of which hereby is incorporated in it's entirety into the disclosure of this application.

SUMMARY OF INVENTION

The electro-luminescent method and testing system described in U.S. Pat. No. 4,507,605 works equally well with a variety of single sided, and complex multi-layered board and substrate designs and topographical layouts with pads and separations below 10 mils on boards up to 6 inches square dimensions. Most dual sided boards, boards with metal frames and heat sinks, chip carriers and substrates with through hole conductor connections also can be tested by this known system which provides an electro-optical read-out of the characteristic electro-luminescent light pattern "signature" produced by a particular board or substrate under test.

The present invention makes available to the industry an improved electro-luminescent gas testing method and system having automatic means for obtaining a characteristic electrical "signature" read-out of the conductivity characteristics of a printed circuit board, substrate or other like item under test which is compared to a prestored corresponding conductivity characteristic of a model of standard board of substrate known to be good for comparison in a computer and providing a measure of the conductivity characteristic of the printed circuit board, substrate or other like item under test.

Another feature of the invention is the provision of a second metallic grid assembly which is physically located below the platen holder for the item under test so that either or both sides of a PC board or substrate as well as intervening layers and through connections literally can be tested either with electrical and/or electro-optical read-out.

In practicing the invention, an improved testing method and system is provided which employs electro-luminescent gaseous discharge within a sealable, substantially gastight chamber for the electrical and electro-optical testing of items such as printed circuit boards, ceramic substrates and other like items for continuity and other electrical conductivity characteristics. The chamber has a readily opened and closed access opening for placement of items under test therein together with automatically controlled means for purging and introducing a fresh gaseous charge capable of electro-luminescence at low pressure into the sealable chamber with an item to be tested in place. An automatically controllable movable probe means is disposed within the sealable chamber for coupling one terminal of a variably controlled, constant current source of electric potential to desired test points located on the surface of an item under test. A grid-like array of conductive wires lying in the same plane is supported within the sealable chamber and spaced-apart from the item under test. Automatically controllable means are provided for coupling the remaining opposite polarity potential terminal of the variably controlled constant current source of electric potential to the grid-like array of conductive wires whereby electro-luminescent plasma is produced in the gaseous atmosphere within the sealable chamber around the test points contacted by the probe means and around all of the conductive points on the item under test having electrical continuity therewith which are exposed to the gaseous atmosphere. The method and system are completed by the provision of measuring means for measuring the voltage drop (i.s. potential difference) produced across the electro-luminescent plasma for respective settings of the movable probe for comparison to a standard and use as a measure of the continuity and other electrical conductivity characteristics of the item under test.

A further feature of the invention is the provision of a testing apparatus having the above set forth characteristics of a second array of conductive wires lying in the same plane and spaced apart from the item under test on the side thereof opposite the first mentioned grid-like array of conductive wires together with means for selectively measuring the voltage drop across the electro-luminescent plasma produced between either one of the respective grid-like arrays and the item under test, or both.

Still another feature of the invention is to make the sealable gastight chamber in a manner so that either its top or bottom or both are fabricated from glass or other transparent material and constructing the grid-like array of conductive wires in a manner so that it readily can be seen through. To this arrangement automatic scanning photometer detectors or other similar electro-optical viewing instruments for scanning either the upper or lower surfaces, or both, of the item under test are provided for deriving output electrical signals representative of the visual light pattern "electro-optical signature" produced by the electro-luminescent plasma discharge while the item is under test, either separate from or in addition to a simultaneously obtained "electrical signature" read-out.

Still a further feature of the invention is the provision of a testing method and system having the above set forth characteristics which further includes a central control computer having a display for automatically controlling operation of the sealable gastight chamber after opening and closing to insert a new test specimen including purging and recharging of the sealable chamber with fresh ionizable gas. The control computer further serves to automatically position the movable probe and selectively provides energization to the grid-like array of conductive wires from the variably controlled source of constant current electric potential at a preselected current setting determined by the control computer. The control computer also is responsive to the measuring means for automatically deriving an indication of the electro-luminescent plasma resistance at each movable probe setting pursuant to the relation:

$$\text{Plasma Resistance} = \frac{\text{Voltage Supplied}}{\text{Current}}$$

for comparison to a standard resistance value for the setting of the movable probe stored in the computer and deriving an automatic output indication of the conductivity characteristic "electrical signature" of the item under test for that setting.

In a preferred embodiment of the invention, the electro-luminescent method and testing system provides a "total signature" read-out comprised of both the "electrical signature" and the "electro-optical signature" obtained from reading out both sides of a test board or substrate simultaneously at different preselected current and voltage levels.

BRIEF DESCRIPTION OF DRAWINGS

These and other objects, features and many of the attendant advantages of this invention will be appreciated more readily as the same becomes better understood from a reading of the following detailed description when considered in conjunction with the accompanying drawings, wherein like parts in each of the several figures are identified by the same reference character, and wherein:

FIG. 5 is a classic voltage versus current characteristic curve of an electro-luminescent plasma discharge occurring in an ionizable gas such as neon, argon and the like.

BEST MODE OF PRACTICING INVENTION

During the manufacture or subsequent handling of PC boards and substrates, defects such as isolation discontinuities (cracks) in a circuit pathway, or an unwanted conductive connection (short) between adjacent runs, may develop. If these defects are not discovered until other components have been bonded to the pads or terminals of the PC boards and/or substrates, it is much more difficult and expensive to find and repair any such defects which may exist. To deal with this problem, equipment was developed for automatically testing PC boards and substrates for continuity verification before components were attached to the boards. This equipment works by applying to the various pads, voltages or other test signals, and then detecting the voltage or other signal at other specified pads or terminals on the PC boards or substrates. With a voltage applied to a particular pad, all other pads which are interconnected via conducting pathways to this first pad, should have a voltage or signal present. Those which are not by design to have been electrically interconnected via pathways, should not have a voltage or signal present on them. By contacting many or all of the paths or pads simultaneously, and using high speed electronic switching devices to connect and measure the respective voltages, testing of the boards could be accomplished relatively quickly.

The first automatic testing device used in the industry employed a "bed-of-nails" fixture to contact all of the pads of a printed circuit board or substrate simultaneously. This fixture consisted of a frame with dozens or sometimes hundreds or thousands of small, metallic and spring-loaded contact points. Each contact has a wire extending from it to a machine which contains a test voltage source and measurement equipment using suitable interconnecting switches. To insure that each contact point makes good electrical contact to the proper pad, the contacts are usually gold plated and the frames undergo precision manufacturing. Making such a "bed-of-nails" fixture for each circuit board design is quite expensive and can take several weeks to manufacture. As the number of contact points increases, the amount of pressure applied to the fixture and circuit board or substrate must also increase to assure good contact. This requirement itself can cause harm to the boards or substrates or damage the pads, thus complicating the problem the equipment originally was designed to overcome. Lastly, each type or size of circuit board or substrate design to be tested requires its own particular "bed-of-nails" fixture.

The trend to quantum increases in complexity coupled with down-sizing of electronic circuit boards has resulted in greater numbers of narrow sized conductive pathways and pads being fitted onto an increasingly smaller area. These smaller, more fragile, traces and pads are more susceptible to shorts and discontinuities in board manufacture. On a ceramic substrate or chip carrier, there may be dozens or even hundreds of pads, each of which can be as small as 5 mils (5 thousands of an inch) and spaced apart a comparable distance. This has resulted in more expensive testing fixtures which are more delicate and thus more susceptible to damage from handling and use.

The difficulties of the standard test fixtures to work dense and fragile ceramic substrates or chip carriers resulted in the development of a specialized fixture called a probe card. The probe card uses very fine bent wires instead of pins to contact the pads on a substrate or chip carrier being tested. The probe card fits around the substrates or chip carriers in such manner that the fine wires make contact with the substrate or chip carrier pads. Like the larger "bed-of-nails" fixtures, probe cards must be precision manufactured, are expensive and susceptible to handling damage, and must be specially build for a particular design of ceramic substrate or chip carrier.

Another known device is the dual or "flying" probe device using two fine needle-like, metallic points, programmed to function on an x and y coordinate basis to contact pads on the substrate or chip carrier. These devices function at slower overall test speeds and also can make metallic scratches on the pads which can cause component bonding failures.

Capacitive measurement testers using a single programmable probe and an external ground plane measure, compare the capacitance values measured on a test board to those measured on a known "good" standard board. If a short is present on a traceor pathway, the capacitance measured will increase. If an open is present, the capacitance will decrease. In order for the capacitance technique to work, the circuit deviations caused by board manufacturing defect variations must be less than those caused by the opens and shorts. Also the capacitance tester functions at relatively slow test speeds.

Figure 1:
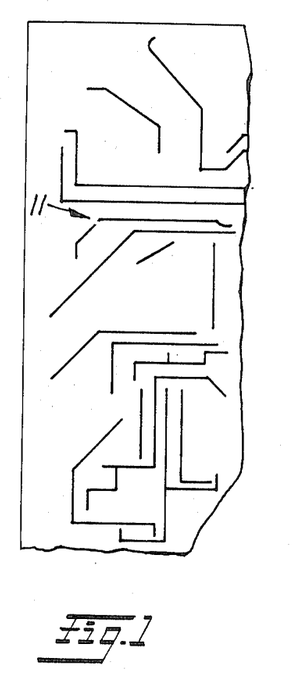
FIG. 1 is a partial plan view illustration of a portion of the upper surface of an unpopulated printed circuit board having a micro crack occurring in one of the conductor runs printed thereon.
Figure 2:
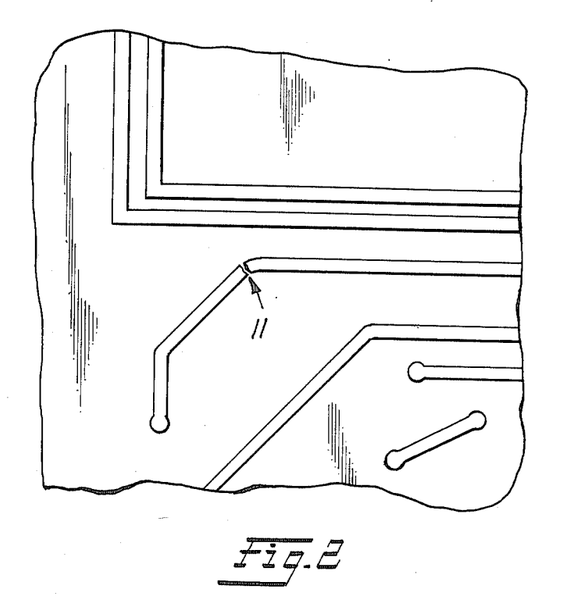
FIG. 2 is a six time magnification of the same micro crack of the printed circuit board illustrated in part in FIG. 1.
Figure 3:
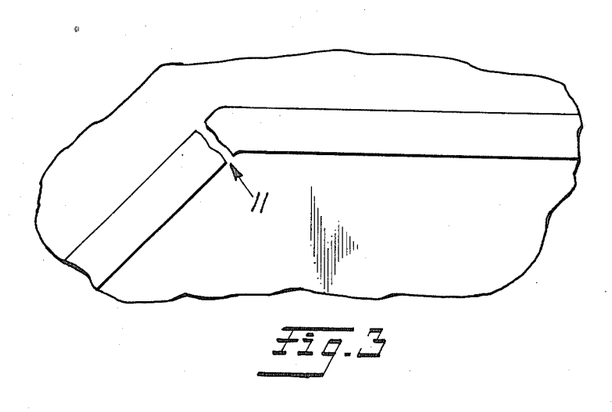
FIG. 3 is a fifty time magnification of the same micro crack shown in FIG. 2.

The capacitance techniques, and the other known automatic testing fixture and probe testers, apply an electric potential through the conductor under test so that it can bridge a 1 micron (.0001) crack. There is also no way for these testers to display where micro cracks or where shorts are. Thus, these known testing devices can fail to detect micro cracks in a circuit being tested. The series of illustrations depicted in FIGS. 1-3 of the drawings are provided to clearly reveal the nature of this problem. FIG. 1 is a partial plan view of the top of a printed circuit board which has present in one of its conductive runs a fine micro crack. Arrow 11 shown in FIG. 1 points to the general vicinity where the micro crack occurs in the circuit board. FIG. 2 is a six time magnification of the picture shown in FIG. 1 so that it is easier to see where the micro crack 11 exists in the conductive run. FIG. 3 is a 50 times magnification illustration of the same micro crack 11 and clearly reveals the existence of the gap or open in the conductive pathway in question. Even without magnification, the discontinuity of the plasma makes detection and precise location easy for an untrained Operator. Printed circuit board and ceramic substrate manufacturers and users all are increasingly concerned about the problems resulting from hairline separations or micro cracks in the conductor pathways such as that illustrated in FIGS. 1-3. Failure to detect such micro cracks at the bare board and pre-component loading production level, can result in defective products in the field. Micro cracks may still allow many circuits to operate satisfactorily, but these can lead to electrical "noise" and eventual circuit failure, particularly under the stress of field temperature variations which can cause the cracks to widen. In all of the other known automatic testing methods mentioned above, a test electric potential is applied *across* the conductor under test. An electric potential applied *across* the micro crack can bridge the micro crack if it is not wide enough and the resistive test drive voltage is high enough. At atmospheric pressure, electric current will bridge a 1 inch crack at about 30,000 volts and a crack of the order of a micron can be bridged by a 30 volt test current. The present invention overcomes this problem in an efficient and reliable manner as will be described more fully hereafter.

U.S. Pat. No. 4,507,605, noted above, discloses an electro-luminescent gas plasma discharge method for the automatic testing of PC boards, ceramic substrates, chip carriers and other like items wherein the PC board or substrate to be tested is placed into a sealable gastight chamber along with an ionizable gas through a suitable access door. In this known tester, the sealed gastight chamber is provided with a transparent glass cover through which an operator and an automatic scanning photometer detector can view the item under test. Any completed inner-layer of a multi-layer PC board or substrate or the completed top layers of a single or dual sided board or substrate can be tested by this technique. After placement of the item to be tested within the chamber and the chamber sealed, the chamber is first evacuated in about 2 seconds to approximately 1 hundred millitors, and then a suitable ionizable gaseous atmosphere, preferably formed by approximately 8 cubic centimeters of argon, is introduced at 12 psi into the sealed chamber, which results in a pressure of 3–5 tors. Argon is harmless, inert, non-flammable and non-toxic so that it is an ideal gas for this application. The ionizable gas is introduced after placement of the item under test and evacuation (purging) before charging the interior of the chamber with fresh gas. Then a low voltage in the range of 150–300 volts is applied under approximately 2 grams of force by a small, single movable probe to a particular pathway or pad on tne item under test. A suitable movable probe is disclosed in U.S. Pat. No. 4,527,119 issued July 2, 1985 for a "High Speed, Low Mass, Movable Probe and/or Instrument Positioner, Tool and Like Items Suitable for Use in a Controlled Environment Chamber" assigned to Testamatic, Inc. (the same assignee as the present invention), the disclosure of which hereby is incorporated into the disclosure of this application in its entirety.

The movable probe with a negative potential is servo operated and is under the control of a control computer that is preprogrammed by data entry of the x-y coordinates of the circuit board test points. Simultaneously, the opposite polarity potential also is applied to a metallic conductive, grid-like array located horizontally above the item under test. The grid-like array consists of straight strings of fine, almost invisible conductor wires and acts as an anode within the gastight chamber. Application of the opposite polarity potentials across the grid-like array and points on the circuit board under test selected by the movable probe, produces an ionizing potential field within the gastight cnamber which causes the gas immediately above and adjacent to the electrically energized conductive pathways and pads to emit light or other electromagnetic radiation in accordance with the well know electro-optical "cathode luminescence" phenomenon.

Figure 4:
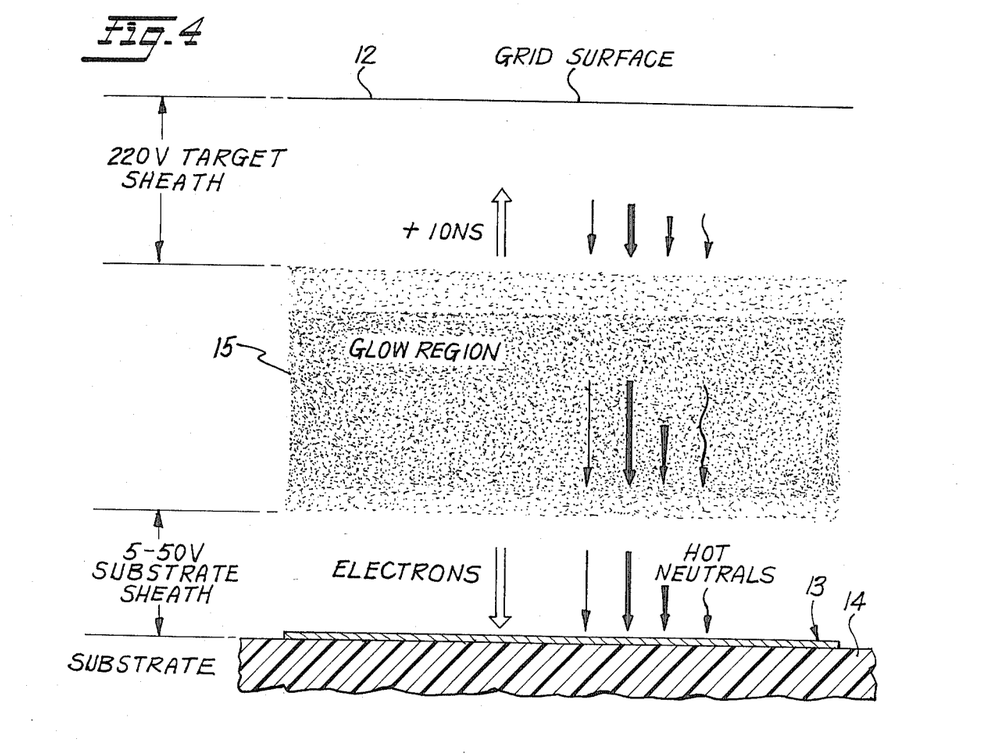
FIG. 4 is a partial, schematic illustration of the physical and electrical characteristics of an electro-luminescent gas plasma discharge of the type occurring in the known Testamatic electro-luminescent test system as well as the present invention.

The basic principle of the electro-optical "cathode luminescence" phenomenon is illustrated in FIG. 4 of the drawings wherein it is seen that two electrodes comprised by the grid-like array of conductor wires 12 and a spaced-apart electrically conductive pathway 13 on a printed circuit board or substrate 14 under test are immersed in a low pressure gas and subjected to an increasing DC voltage of opposite polarity. Under these conditions, a voltage difference between the gridlike array 12 and the electrically energized conductive plane 13 is reached at which ionization of the gas between the grid and the conductive pathway occurs. With appropriate current limiting, the cathode or negative electrode (comprised by the conductive pathway 13 in the Testamatic tester) will exhibit electro-luminescent gas discharge. This is depicted by the stippled region 15 interposed between the grid 12 and conductive pathway 13 in FIG. 4. The electric field created in this region causes electrons in the atoms of the argon gas under low pressure to move in a certain manner, and this movement results in the release or emission of energy in the form of "light"0 or other electromagnetic radiation from the gas. It is the same basis for numerous gas discharge displays such as the well know neon lights, which in physics has been a well known phenomenon for a number of years.

Figure 6:
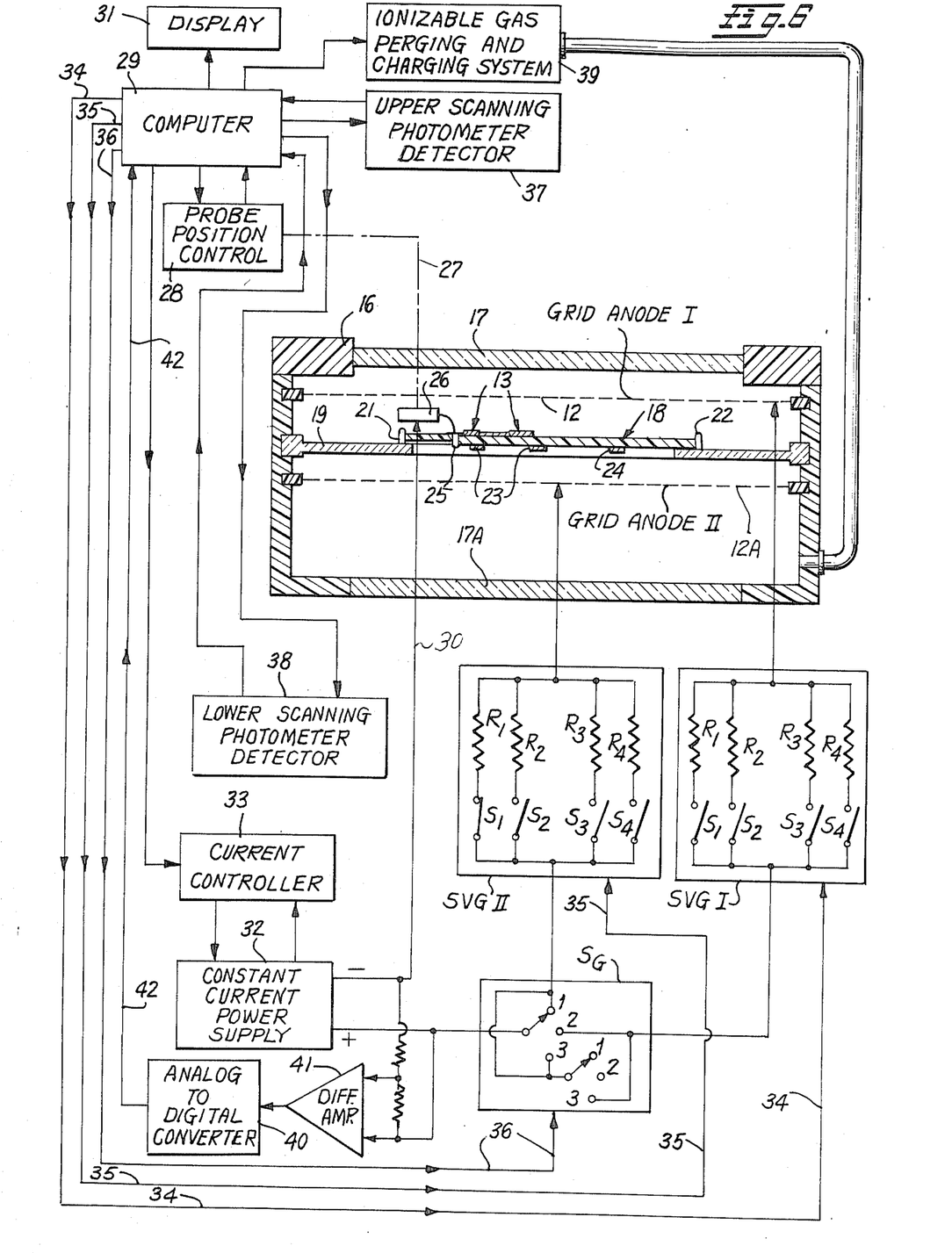
FIG. 6 is a functional block diagram illustrating the essential elements comprising an automatic electro-luminescent gas testing method and system with both electrical and electro-optical read-out provided by the present invention.

FIG. 6 is a functional block diagram which illustrates an improved method and system for performing electro-luminescent gas plasma discharge testing of printed circuit boards, ceramic substrates, chip boards and other like items according to the present invention. This method and system is an improvement upon the electro-optical testing system described and claimed in U.S. Pat. No. 4,507,605. As noted earlier, the disclosure of U.S. Pat. No. 4,507,605 has been incorporated in its entirety into the disclosure of this application.

The testing system is comprised by a sealable, gastight chamber 16 constructed preferably of insulating material and having a glass or other transparent top 17 and bottom 17A through which the interior of the chamber 16 can be viewed. The chamber includes an access opening (not shown) by means of which a printed circuit board, ceramic substrate, chip carrier, or other like item 18 can be supported within chamber 16 on a transparent platen or other holder 19. Locator pins indicated at 21 and 22 are provided to properly position the test item 18 within the chamber upon insertion. The particular PCB 18 under test includes a number of conductive pathways shown at 13 located on its upper surface and lower conductive pathways 23 and pads or terminals 24 located on its lower surface as well as conductive through connections or vias indicated at 25. A movable probe 26 is located within the interior of chamber 16 for contacting the vias, lands, conductive paths and preferably terminal points such as 23 and 24 on the upper surface of the PCB. It is believed obvious to those skilled in the art that a second movable probe mechanism 26 could be provided for selectively contacting test points on the lower side of a PC board or substrate in the same manner shown for probe 26. However, for the sake of sixplicity of the drawings the lower movable probe has not been illustrated in FIG. 6.

The movable probe 26 is disclosed more fully in U.S. Pat. No. 4,527,119, the disclosure of which has been incorporated into the disclosure of this application, and reference is made to that patent for a more detailed description of the movable probe. Briefly, however, it can be said that the probe 26 is moved by means of mechanical interconnections depicted by the dash-dot line 27 through an automatically controlled probe position control 28 under the control of a central control computer 29. As is usual, control computer 29 includes a display 31.

Gastight test chamber 16 also includes within its interior a grid-like array 12 of conductive wires identified as Grid I Anode which lies in the same plane within the cnamber 16 with the grid being spaced apart from the PCB or other item 18 under test. In the embodiment of the invention shown in FIG. 6, a second or lower grid-like array 12A of conductive wires, shown as Grid II Anode, also is provided within the interior of sealable chamber 16 with the conductive wires of the grid-like array 12A lying in the same plane and spaced apart from the item 18 under test on the side thereof opposite the first-mentioned Grid I Anode 12. The Grid I and Grid II Anodes 12 and 12A preferably are constructed in the manner described in co-pending U.S. patent application Ser. No. 901,595, issued Aug. 29, 1986 —Robert M. Zeh—inventor, for an "Electro-luminescent Automatic Testing Apparatus and Method for Ceramic Substrates, Printed Circuit Boards and Like Items With Background Illumination Suppression", assigned to Testamatic Corporation, the disclosure of which hereby is incorporated into the disclosure of this application in its entirety.

For a more detailed description of the construction and preferred method of operation of the Grid I and Grid II Anodes, reference is made to U.S. Application Ser. No. 901,595. Briefly, however, it can be said that the grid-like array of conductive wires in both the Grid I Anode 12 and the Grid II Anode 12A, is comprised by a plurality of individual, spaced-apart, parallel, extremely fine exposed conductor wires whose conductive surface is directly contacted by the gaseous atmosphere within chamber 16. All of the conductors in the array 12 lie within the same plane that is substantially parallel with the planar upper surface of item 18 under test in the case of the Grid I Anode and with the planar lower surface of test item 18 in the case of the Grid II Anode.

In operation, the conductor wires of each array 12 and 12A are maintained at the same electric potential with respect to each wire in the same grid-like array. Each conductor wire in the respective grid-like array is connected in series electrical circuit relationship with a plurality of different value voltage limiting resistors R1, R2, R3 and R4 by means of a respective selector switch S1, S2, S3 and S4 located within a grid voltage switching control SVG I in the case of the upper Grid I Anode or SVG II in the case of the lower Grid II Anode 12A. Each of the grid voltage controlling networks SVG I or SVG II are connected through a commonly connected grid anode switching control SG for selecting which anode grid 12 or 12A is to be electrically energized.

Switching control SG is supplied from the positive output terminal of a constant current power supply 32 which has its negative output terminal connected through a conductor 30 to the movable probe 26 for application to selected conductive pads, pathways, vias, terminals or other conductive surfaces on the printed circuit board, ceramic substrate or other test item 18. The constant current power supply 32 is of conventional, commercially available construction and is under the control of a commercially available current controller 33 that in turn is controlled by the central control computer 29.

In operation, control computer 29 adjusts the current controller 33 so that a desired selected value of current is supplied by the constant current power supply across its output terminals and automatically maintained at the desired current setting by the current controller 33. The voltage of the excitation potential supplied to either the Grid I Anode 12 or the Grid II Anode 12A, or both, via the commonly connected selector switch SG will be determined in part by the setting of the voltage limiting resistors of the respective grid voltage switching circuits SVG I and/or SVG II which also are under the control of the central control computer 29 via conductors 34 and 35, respectively. Similarly, the setting of the commonly connected grid selector switch SG is controlled from the central control computer 29 via conductor 36.

In addition to the above briefly described elements, the system of FIG. 6 further includes an upper scanning photometer detector (SPD) 37 which may comprise an automatically operated television vidicon, image orthicon or other automatically operated scanning image dissector device which derives an output characteristic "electro-optical signature" electric signal that is supplied back to the control computer 29. Under the control of computer 29, SPD 37 is programmed to automatically scan those electric pads, terminals, vias, and conductive pathway portions which are known to be by design electrically connected to a pad being touched by movable probe 26 at a particular setting known to the computer. If the item under test is satisfactory, these areas of the item should be lighted by the electro-luminescent plasma discharge and result in the production of an output characteristic "electro-optic signature" signal by the SPD for supply back to the computer for comparison to a standard derived from a known "good" board of the same design stored in the computer for the same setting of the movable probe. From this comparison a pass/fail determination can be made with regard to the continuity and other conductivity characteristics of the board under test by the operator.

In preferred embodiments of the invention, the bottom 17A of the sealable, gastight test chamber 16 is formed of transparent glass or other transparent insulating material and further includes a lower scanning photometer detector (SPD) 38 which likewise is controlled by the central control computer 29 and provides its characteristic "electro-optical signature" output signal back to the control computer 29 for comparison to the standard insofar as the bottom surface images (to be described hereafter) of the test item are concerned.

As explained more fully in the above referenced U.S. Pat. No. 4,507,605, the system is completed by an ionizable gas purging and charging system shown at 39 which also is under the control of the central control computer 29 for automatic purging the interior of the test chamber 16 of previously used gas and atmospheric air after the chamber has been opened and a previous test item removed and replaced by a new test item and the access door closed and sealed. At this point, the ionizable gas purging and charging system draws a small vacuum of the order of 100 millitors for a period of seconds to withdraw previously used gas and any air that has leaked into the chamber, and then automatically introduces a new charge of ionizable gas, such as argon, into the chamber at a low pressure of the order of 12 psi gauge. This is done automatically under the control of computer 29 following each removal and insertion of a new test specimen 18.

The system is completed by measuring means for measuring the voltage drop (i.e. the potential difference) produced across the electro-luminescent gas plasma in series with the limiting resistor for respective settings of the movable probe 26. This measuring means is in the form of a differential amplifier 41 of conventional, commercially available integrated circuit, operational amplifier construction (connected in its differential amplifier mode of operation). Differential amplifier 41 has its input terminals connected across the output terminals of the constant current power supply which measures a portion of the $^{N}220V$ 32 and its output supplied back to the input of control computer through an analog 29 to digital convertor 40. By this means, the voltage developed across the plasma produced within chamber 16 for each setting of the movable probe 26, will be sensed and supplied back to the input of control computer 29 through the conductor 42 for comparison to a standard voltage value derived from the standard "good" board, substrate or other item similar to the item under test for the given movable probe setting and current excitation values. The comparison thus achieved with the standard can be made on a go, no-go basis within prescribed limits to determine the acceptability of an item under test.

Having described the preferred construction for an electro-luminescent system and method for testing unpopulated printed wiring circuit boards, ceramic substrates, and the like having both electrical and electro-optical read-out in accordance with the invention, its use to perform testing in different operating modes will be described.

The first operating mode is defined as the electrical read-out testing mode wherein only the measure of the electrical characteristics of an item under test is achieved without requiring the use of the scanning photometer detector 37 or 38 or for that matter without requiring the use of a transparent top or bottom for the chamber 16. Hence, it should be noted that for those test applications where redundancy in testing is not required, and only a quick and low cost measure of the electrical conductivity characteristics of a PC board, substrate or other like item is required, a relatively inexpensive chamber 16 may be employed which does not include facilities for visual observation of the specimen under test or require the use of the upper and/or lower scanning photometer detectors 37, 38.

Figure 5:
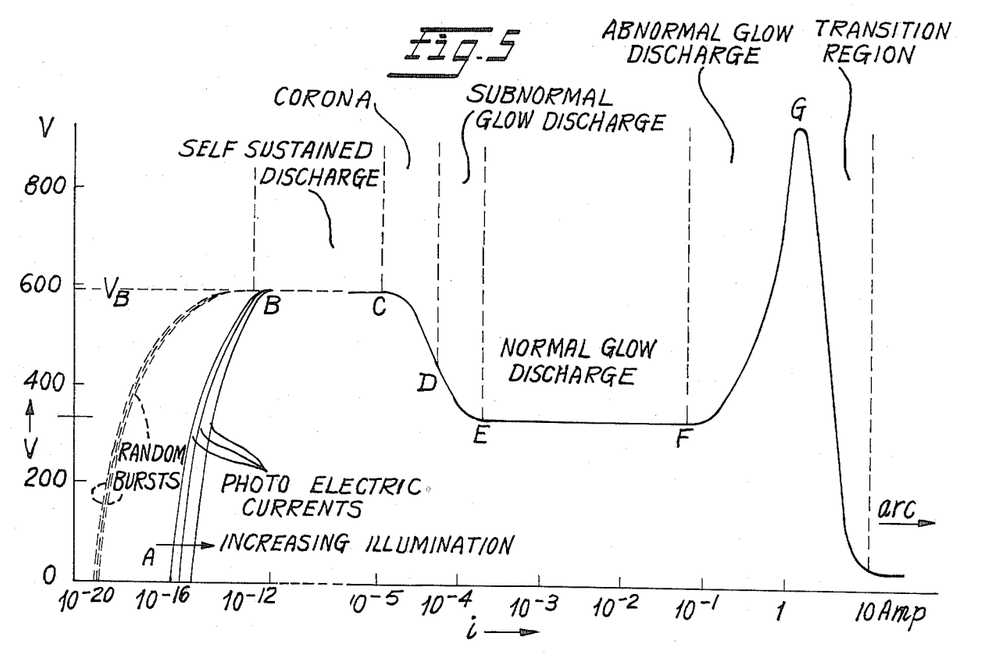

Using the electrical read-out mode of operation the testing system is employed to effectively measure the conductivity characteristics of PCB, substrate or other like item under test by sensing the changes in resistance of the electro-luminescent gas plasma which are induced by variations in the conductivity characteristics of the test specimen even with respect to pathways, runs, vias and the like that are internally disposed within the item under test and not exposed to the gaseous atmosphere. This is accomplished due to the physical characteristics of the electro-luminescent gas plasma within chamber 16. It will be appreciated, therefore, that the improved method and system uses all of the unique features of an electro-luminescent gas plasma to achieve satisfactory electrical connection of an energizing test electric potential to the very small and fine terminal pads and points of high density circuit boards, ceramic substrates and the like in a highly reliable low cost manner without endangering or impairment of the conductive surfaces of the item under test. The system may also be used as a direct view device where the operator will correct printing errors during construction of multi-layered devices. FIG. 5 is a typical voltage/current characteristic curve of an electro-luminescent gas plasma which was published by Gordon Francis in an article entitled "The Glow Discharge at Low Pressure"—page 54, section 2, appearing in a collection of technical articles published by Springel Verlog—O.H.G. —Berlin, Germany—1956. The voltage-current characteristic curve shown in FIG. 5 is for a large cathode gas tube, but the curve is representative of the characteristic voltage/current variations occurring in the sealable gastight chamber 16 of the Testamatic testing system during operation. For given setting of the movable probe 26 on a test PC board, that test board by design should have known conductivity characteristics (which are inversely related to the resistivity characteristics of the test board) for a particular setting of the movable probe. In the event of an open circuit due to a crack in a conductor pathway, a neckdown due to thinning of the conductor pathway at a particular point, a pinhole in the pathway of the like, the resistance of the conductive pathway or run will increase.

With the prior knowledge of what the design resistance of the conductor pathways for a test board ought to be at a particular movable probe setting, the control computer 29 can be programmed to set the current controller 33 to provide a constant current input negative potential to the probe 26 and a positive polarity constant current input potential through the grid selector switch SG and a selected one or both of the grid voltage limiting resistor switches SVG I and/or SVG II to either grid anode I or grid anode II, or both. By appropriate adjustment through the computer of the applied current level, the chamber can be made to operate along the current voltage characteristic curve shown in FIG. 5 so as to control the production of gas discharge plasma within the region C to E using the constant current controller 33. Region C to E while not quite linear, is extremely sensitive to low ohmic changes in resistance value in the PC board and substrate conductor runs which have been energized by a particular setting of probe 26. In case of the occurrence of any defects such as cracks, neckdowns, pinholes, or other variations in the conductor runs, these ohmic resistance changes will be reflected in the voltage drop (i.e. potential difference) appearing across the output of constant current power supply 32 and sensed by differential amplifier 41. They are supplied back to the control computer 29 for measurement and comparison to standard values earlier derived and stored in the computer from a "good" PC board test specimen of like design and construction to that being tested for each particular movable probe position setting.

Operation in the above-described manner is made possible by the fact that the gap resistivity while not uniform across the gap (i.e. space between Grid I Anode or Grid II Anode and the substrate conductive surface), is predictable. The local resistivity at different points along the length of the gap will depend upon the local charge (or ion density). With no ions present, the ionizable gas is an insulator and reflects substantially infinite resistance. At the onset of self-sustained discharge in the region B to C and beyond of the characteristic curve shown in FIG. 5, ions are formed at the grid anode surface since they have low mobility compared to electrons. These ions affect the field strength at the grid anodes and limit the current (keep it from becoming infinite). Consequently, the conductivity near the anode grid surface is higher than at other locations along the gap. When ions do arrive at the cathode (conductive surface of the substrate being tested), they wait their turn to be discharged by electrons emitted from the cathode. The weak field in the vicinity of the cathode causes the ions to bunch up near the cathode surface. As a result the conductivity across the gap near the cathode is higher than the other points within the gap except near the grid anode surface. The increased conductivity in this latter region near the cathode results in low plasma resistance near the cathode and is why it is possible to measure small resistance changes occurring in a circuit under test while operating within the region C to E on the characteristic curve shown in FIG. 5. The higher the resistance encountered in the circuit under test, the closer the voltage will be to point C on the characteristic curve of FIG. 5. In this region, changes are not entirely linear; however, it is adequate to detect defects like neckdown, micro cracks, pinholes and the like which cause an increase in conductor run resistance. By sensing the resistance of the plasma discharge in chamber 16 (i.e. of the applied voltage appearing across the output terminals of the constant current power supply 32) with differential amplifier 41 and supplying it back to computer 29, the changes in resistance can be detected for comparison to the standard for a particular setting of the movable probe.

In order to detect short circuits occurring in any of the runs on a board under test at a particular setting of the movable probe, the system is run with more current by appropriate adjustment of the constant current power 32 supply via current controller 33 and control computer 29. When the current approaches point F on the characteristic curve of FIG. 5, any shorts existing in the conductive runs on the item under test will develop a plasma with the limiter being the anode grid resistance introduced via either of the voltage limiting resistor network SVG I and SVG II under the control of computer 29. The existence of shorts in any of the runs at the particular movable probe setting will cause additional plasma power consumption compared to the standard for that probe setting that can be detected by the control computer 29 via the output differential amplifier 41.

With reference to FIG. 4 of the drawings, it will be seen that the plasma voltage gradient is very low (5-50) volts in the gap between the conductive runs on the test substrate surface and the glow region and that this voltage gradient is vertically above the substrate. Under these conditions, there is no reason for electrons to attempt to jump even the smallest crack (including micron-sized cracks). This means that the crack (including micro-sized cracks) can be visually (electro optically) detected by discontinuity of the plasma glow beyond the crack as was described in U.S. Pat. No. 4,507,605, and also by measuring the decrease in plasma power being supplied from constant current power supply 32 resulting from a decrease in the sensed voltage drop across the electro-luminescent plasma as compared to the standard for the probe setting stored in control computer 29.

In addition to the above-discussed test runs, the electro-luminescent gas plasma testing system also is sensitive to non-uniform current distribution which may be due to manufacturing techniques or conductor non-uniformity the product under test. This non-uniformity can be scanned electro-optically for differences in light intensities above the pads on the same net. Additionally, either increases or decreases in the plasma power caused by the non-uniformity will be sensed by differential amplifier 41 and sent to computer 29 for comparison to the approximate standard for the probe setting in question. This capability may provide some answers as to why some identically wired units oscillate and some work well.

In all of the test measurements described above, it is necessary to have the control computer 29 so electronically programmed that it can compensate for the amount of exposed conductor for any given setting of the movable probe on a test item. The computer then can calculate the actual plasma resistance change by a simple application of the Ohm's law since the measured voltage across the plasma will vary in proportion to the resistance of the plasma. This computation is made in the control computer by application of the formula:

$$\text{Plasma Resistance} = \frac{\text{Supply Output Voltage}}{\text{Current Set by Computer}}$$

The resultant plasma resistance readings then are compared by the computer to standard resistance readings for the appropriate movable probe setting for fault determination.

From the foregoing description, it will be appreciated that the plasma resistance measurement technique is ideally suited for testing feed-through conductors which connect circuits on both sides of a circuit board as well as internal conductive layers which are not exposed to gaseous plasma and cannot be observed by a scanning photometer detector read-out method. It is a very practical and low cost method of quickly testing both completed and in-process multi layer substrates and printed wiring boards by testing each layer prior to the formation of the next inside layer on a pass/fail basis.

In order to provide test systems having a redundant, electrical resistance and electro-optical read-out of the electro-luminescent gas plasma discharge, and thereby improve the testing measurement of particular types of PC boards and substrates, a preferred embodiment of the invention further includes upper and lower scanning photometer detectors 37, 38 and employs a sealable gastight chamber 16 having both a transparent top 17 and a transparent bottom 17A with the upper scanning photometer detector 37 viewing the upper surface of an item 18 under test while the lower scanning photometer detector 38 views the bottom surface of the item.

The electro-optical method of testing, as is described more fully in the above-referenced U.S. Pat. No. 4,507,605, will detect neckdown, pinholes or metal splotches on conductor pathways, if they are small enough to increase the resistance of the conductor. This method will identify as an open circuit any resistance above a few hundred ohms. Most serious neckdowns and splotches will exhibit this type of resistance. To detect pin holes, a change in resistance of the same magnitude must occur. With changes of this magnitude, the brightness of illumination of the plasma discharge will be lowered by the occurrence of the defect so that the scanning photometer detector will supply to the control computer a characteristic signature output signal which is significantly changed by the existence of the defect. This will show up as a defect upon comparison of the signal to a standard value for the probe setting already prestored in the memory of the computer.

A decided advantage of the use of the electro-luminescent gas plasma discharge as an electrical connection path to the points on a circuit board or substrate being tested is that the electric potential supplied to any conductor under test is applied between the conductor and the grid assembly located either above or below the substrate, and is not from one end of the conductor to the other. Hence, there is *no* potential developed *across* a micro crack and therefore there is no reason for the micro crack to be easily bridged. Consequently, there is no glow discharge produced at the end of the conductor on the side of the micro crack away from the interconnection of the conductor run to the pad that is supplied by the movable probe. This lack of glow illumination on the open ended metallic trace during inspection will be easily seen by the scanning photometer detector or operator due to the substantial variation in light intensity of the plasma discharge on either side of the micro crack in the conductor run in question. The illumination intensity on the side of the micro crack where the electric potential has been applied by a probe contact, will have a glow discharge at an acceptable level. On the other side of the micro crack (or metallic separation), as small as 1 micron in width, there either will be no or a much lower level of illumination due to the lack of excitation potential on the portion of the conductor.

This capability makes the instrument extremely useful as an in-process tool for detecting micro cracks in conductor runs formed on inner layers of multi-layer boards and substrates before the next layer is applied during manufacture. When thus detected and identified, the crack can be repaired before the next layer is bonded to the circuit board or substrate. Thus, micro cracks can be discovered and repaired during manufacture at a critical time in the fabrication of multi-layer boards before the complete multi-layer board is assembled and tested only to reveal the existence of the micro crack in an inner layer. Scrappage losses can be reduced to a minimum by the use of this technique and yields improved.

It should be further noted that it is not necessary to examine the entire glow patterns produced at each setting of the movable probe in order to determine shorts, discontinuities and conductivity characteristics of the inter-connected net. Instead, it is necessary only to examine the selected terminal test points. The scanning photometer detector need only measure the light intensity of the electro-luminescent plasma discharge at each terminal "electrically excited" pad interconnected with the pad touched by the movable probe. The computer need only determine whether the plasma discharge glow intensity is acceptable for continuity at all such test points, which signifies that an "open" condition does not exist. If any one of the terminal pads under test should fail to emit a cathode glow, an "open" condition by pad number is reported through the computer data print out and display screen. Similarly, if the scanning photometer detector in its simultaneous scanning mode capacity scans over the entire test piece, detects a cathode glow in a pad or conductor pathway not programmed and scheduled to be lighted in that location at that setting of the movable probe, the existence of a "short" condition is reported. These "shorts" also are reported by pad location in alpha-numeric identifier through the computer data print-out and also on the computer display 31.

In practice, strings (groups of conductive pathways, traces or pads, which are electrically interconnected to each other) are contacted one at a time in a predetermined sequential order by the servo controlled movable probe. The probe is moved to the desired points under control of computer 29 within an x-y plane on the surface of each test item 18. The primary software program for computer 29 contains a complex mathematical algorithm which sets the parameters of the movable probe movements. Since the probe device could "shadow" the electro-luminescent plasma glow discharge at different points on the circuit board under test as the probe moves across the test board, the test cycle begins in a specific corner of the test board and proceeds down and across to completion at a diagonally opposite corner.

As noted earlier, for particular product applications, it may be desirable to so tailor the testing system that only a single (either lower or upper) mechanical photometer detector is provided along with either a single (lower or upper) grid anode depending upon the design of the circuit boards, substrate or other like items to be tested. In certain testing applications, the electro-optical read-out feature may not be required. For these applications the transparent top and bottom could be eliminated along with the scanning photometer detector. In such testers it may be possible to use only a single grid-like array in place of the two shown in FIG. 6 with the single grid being either above or below the test piece holder.

From the foregoing description, it will be appreciated that the invention makes available a new and improved method and system for the automatic inspection, test and measurement of the electrical continuity, existence of shorts and open circuits and other conductivity characteristic affecting conditions existing on prefabricated but unpopulated circuit boards, ceramic substrates and other like items. The novel method and system is capable of providing a total characteristic "electrical signature" as well as "electro-optical signature" of an item under test whereby for extremely important product applications, redundant testing can be accomplished simultaneously with a considerable increase in reliability through comparison of the resultant redundant outputs to presorted standards to achieve reliable and rapid testing with respect to products requiring such treatment. The invention further makes available an extremely low cost, purely "electrical signature" characteristic measuring method and system whereby rapid and economic fail/no-fail testing can be achieved with a test item with a relatively simple system at low cost. The systems can be made to be entirely automatic or can be operated manually depending upon the end applications desired.

INDUSTRIAL APPLICABILITY

The invention makes available new and improved methods and systems for the automatic testing of printed circuit boards, ceramic substrates, and other like items for testing the continuity and other electrical conductivity characteristics of the conductive lands, pathways, vias, through connections and other conductive surfaces of a test item whether the conductive areas are located on exterior surfaces or on the interior surfaces of the test item. The testing can be achieved either electrically only or electro-optically through the use of an electro-luminescent gas plasma discharge either with or without a scanning electro-optic viewing instrument and can be either automated under the control of a computer or can be achieved manually.

Having described several embodiments of a new and improved method and system for the electrical and electro-optical inspection and testing of printed circuit boards, ceramic substrates and other like items using an electro-luminescent gas discharge in accordance with the invention, it is believed obvious that changes may be made in the particular embodiments of the invention described which are within the full intended scope of the invention as defined by the appended claims.

What is claimed is:

1. An improved testing system employing gaseous discharge within a sealable substantially gastight chamber for the electrical testing of items such as printed circuit boards, and ceramic substrates and for continuity and other electrical conductivity characteristics, said chamber having a readily opened and closed access opening for placement of items under test therein, means for introducing a gaseous atmosphere capable of electro-luminescence at low pressures into the sealable chamber with an item to be tested in place, movable probe means disposed within the sealable chamber for coupling one terminal of a variably controlled constant current source of electric potential to desired test points located on the surface of an item under test, a grid-like array of conductive wires lying in the same plane within the sealable chamber and spaced-apart from the item under test, means for coupling a remaining opposite polarity potential terminal of said constant current source of electric potential to the grid-like array of conductive wires whereby electro-luminescent plasma is produced in the gaseous atmosphere within the sealable chamber around test points contacted by said probe means and around all conductive points on the item under test having electrical continuity therewith which are exposed to the gaseous atmosphere, and measuring means for measuring the voltage drop produced across the electro-luminescent plasma for respective settings of the movable probe for comparison to a standard and use as a measure of the continuity and other electrical conductivity characteristics of the item under test.

2. A testing system according to claim 1 wherein the grid-like array of conductive wires is comprised by a plurality of individual, spaced-apart, parallel, extremely fine exposed conductors whose conductive surfaces are directly contacted by the gasaous atmosphere with all of the conductors in the array lying within the same plane that is substantially parallel with a planar surface of an item under test and being maintained at substantially the same electrical potential and wherein each individual conductor in the array is connected in series electrical circuit relationship with at least one respective voltage limiting resistor that is physically located outside the sealable gastight chamber.

3. A testing system according to claim 2 wherein each individual conductor wire is suitably connected in series circuit relationship with a plurality of different value voltage limiting resistors that are selectively placed in operating series electrical circuit relationship with the respective conductor wires by a respective selector switch connected between each respective voltage limiting resistor and a constant current power supply terminal whereby any particular desired value voltage limiting resistor may be selectively connected in series circuit relationship with the respective electrical conductors by selective operation of the respective selector switches to thereby control the value of the electric potential supplied to the array of conductive wires.

4. A testing system according to claim 1 further including a second grid-like array of conductive wires lying in the same plane and spaced apart from the item under test on the side thereof opposite the first mentioned grid-like array of conductive wires and with said measuring means for selectively measuring the voltage drop acros the electro-luminescent plasma being responsive to the plasma produced between either of the respective grid-like arrays of conductive wires and the item under test or both.

5. A testing system according to claim 3 further including a second grid-like array of conductive wires lying in the same plane and spaced apart from the item under test on the side thereof opposite the first mentioned grid-like array of conductive wires and with said means for selectively measuring the voltage drop across the electro-luminescent plasma being responsive to the plasma produced between either of the respective grid-like arrays of conductive wires and the item under test or both.

6. A testing system according to claim 4 further including a commonly connected, conductive wire grid-like array excitation potential switching means connected in series circuit relationship between the constant current source of electric potential and both grid-like arrays of conductive wires for selectively controlling the application of excitation electric potential to either one or both grid-like arrays from said constant current source of potential.

7. A testing system according to claim 5 further including a commonly connected, conductive wire grid-like array excitation potential switching means connected in series circuit relationship between the constant current source of electric potential and both grid-like arrays of conductive wires for selectively controlling the application of excitation electric potential to either one or both arrays from said constant current source of potential.

8. An electro-optical testing apparatus according to claim 1 wherein the top of the gastight chamber is transparent and the conductor wires comprising the grid-like array of conductive wires are spaced-apart a sufficient distance between each other within the planar array and are sufficiently fine in cross section so that the array is substantially transparent and readily may be visually seen through and further including at least one electro-optical viewing instrument for viewing the item under test through the transparent top of the gastight chamber and scanning light areas on the surface of the item under test and deriving output electric signals representative of a characteristic electro-optical light pattern produced by the item under test for each setting of the movable probe.

9. An electro-optical testing apparatus according to claim 7 wherein the top and bottom of the gastight chamber are transparent and the conductor wires comprising the grid-like arrays of conductive wires are spaced-apart a sufficient distance between each other within the planar array and are sufficiently fine in cross section so that the array is substantially transparent and readily may be visually seen through and further including respective electro-optical viewing instruments viewing the upper and lower surfaces of the item under test through the respective transparent top and bottom of the gastight chamber for scanning light areas on the upper or lower surfaces of the item under test, or both, and deriving output electric signals representative of a characteristic electro-optical pattern produced by the item under test for each setting of the movable probe.

10. A testing system according to claim 1 further including a central control computer having a display for automatically controlling operation of the sealable gastight chamber including automatic purging and recharging of the ionizable gas after placement of a new item to be tested in the gastight chamber, automatic positioning of the movable probe and selective energization of the grid-like array of conductive wires from the variably controlled constant current source of electric potential at a preselected current setting, said control computer being responsive to the measuring means for automatically deriving an indication of the electro-luminescent plasma resistance at each movable probe setting pursuant to the relation Plasma Resistance equals the Voltage supplied by the source of electric potential divided by the Current for comparison to a standard resistance value for the setting stored in the computer and for deriving an automatic output indication of the conductivity characteristics of the item under test.

11. A testing system according to claim 6 further including a central control computer having a display for automatically controlling operation of the sealable gastight chamber including automatic purging and recharging of the ionizable gas after placement of a new item to be tested in the gastight chamber, automatic positioning of the movable probe, automatic switching of the commonly connected conductive grid-like array selector switch to selectively energize either the upper or lower array of conductors, or both, and automatic energization of the selected grid-like array of conductive wires from the variably controlled constant current source of electric potential at a preselected current setting, said control computer being responsive to the measuring means for automatically deriving an indication of the electro-luminescent plasma resistance at each movable probe setting pursuant to the relation Plasma Resistance equals the Voltage supplied by the source of electric potential divided by the Current for comparison to a standard resistance value for the setting stored in the computer and deriving an automatic output indication of the conductivity characteristics of the item under test.

12. A testing system according to claim 8 further including a central control computer having a display for automatically controlling operation of the sealable gastight chamber including automatic purging and recharging of the ionizable gas after placement of a new item to be tested in the gastight chamber, automatic positioning of the movable probe and selective energization of the grid-like array of conductive wires from the variably controlled constant current source of electric potential at a preselected current setting, said control computer being responsive to the measuring means for automatically deriving an indication of the electroluminescent plasma resistance at each movable probe setting pursuant to the relation Plasma Resistance equals the Voltage supplied by the source of electric potential divided by the Current for comparison to a standard resistance value for the setting stored in the computer and deriving an automatic output indication of the conductivity characteristics of the item under test; and said control computer being further responsive to the output from the electro-optical viewing instrument for comparing the output electric signals characteristic of the electro-optical light patterns for a preselected movable probe setting to thereby derive an output indication of the conformity of the light pattern to a prestored pattern as a measure of the conductivity characteristics of the item under test.

13. A testing system according to claim 9 further including a central control computer having a display for automatically controlling operation of the sealable gastight chamber including automatic purging and recharging of the ionizable gas after placement of a new item to be tested in the gastight chamber, automatic positioning of the movable probe, automatic switching of the commonly connected conductive array selector switch to selectively energize either the upper or lower grid-like array of conductors, or both, and automatic energization of the selected grid-like array of conductive wires from the variably controlled constant current source of electric potential at a preselected current setting, said control computer being responsive to the measuring means for automatically deriving an indication of the electroluminescent plasma resistance at each movable probe setting pursuant to the relation Plasma Resistance equals the Voltage supplied by the source of electric potential divided by the Current for comparison to a standard resistance value for the setting stored in the computer and deriving an automatic output indication of the conductivity characteristics of the item under test; and said control computer being further responsive to the output from either of the upper or lower electro-optical viewing instruments or both for comparing the output electric signals representative of the electro-optical light pattern to a preselected standard pattern stored in the control computer for the selected movable probe setting to thereby derive an output indication of the conformity of the light patterns to a prestored pattern as a measure of the conductivity characteristics of the item under test.

14. An improved testing system employing gaseous discharge within a sealable substantially gastight chamber for electrical testing of items such as printed circuit boards, and ceramic substrates for continuity and other electrical conductivity characteristics; said chamber having a readily opened and closed access opening for placement of items under test therein; automatically controlled means for purging and introducing a gaseous atmosphere capable of electro-luminescence at low pressures into the sealable chamber with an item to be tested in place; automatically controlled movable probe means disposed within the sealable chamber for coupling one terminal of a variably controlled constant current source of electric potential to desired test points located on a surface of an item under test; a grid-like array of conductive wires lying in the same plane within the sealable chamber and spaced-apart from the item under test; automatically controlled means for coupling a remaining opposite polarity potential terminal of said constant current source of electric potential to the grid-like array of conductive wires whereby electro-luminescent plasma is produced in the gaseous atmosphere within the sealable chamber around test points contacted by said movable probe means and around all conductive points on the item under test having electrical continuity therewith which are exposed to the gaseous atmosphere; measuring means for measuring the differences in voltage drop produced across the electro-luminescent plasma for respective settings of the movable probe; a central control computer having a display; said control computer being responsive to the opening and closing of the access opening for automatically controlling a means for purging and refilling the gastight chamber with ionizable gas; said control computer also being responsive to the position of the movable probe means and automatically controlling its repositioning at selected new settings in accordance with a predetermined schedule; said control computer further serving automatically to control the timing of application and current value of the constant current source of potential to the array of conductive wires, and said control computer being further responsive to the measuring means for automatically deriving an indication of the electro-luminescent plasma resistance at each movable probe setting pursuant to the relation Plasma Resistance=Voltage/Current and for comparison of the derived Plasma Resistance value to a standard value for the particular setting of the movable probe for further deriving an automatic output indication of the conductivity characteristics of the item under test at that setting.

15. A testing system according to claim 14 wherein the grid-like array of conductive wires is comprised by a plurality of individual, spaced-apart, parallel, extremely fine exposed conductors whose conductive surfaces are directly contacted by the gaseous atmosphere with all of the conductors in the array lying within the same plane that is substantially parallel with a planar surface of an item under test and all the conductors being maintained at substantially the same electrical potential and wherein each individual conductor in the array is connected in series electrical circuit relationship with at least one respective voltage limiting resistor that is physically located outside the sealable gastight chamber.

16. A testing system according to claim 15 wherein each individual conductor wire is suitably connected in series circuit relationship with a plurality of different value voltage limiting resistors that are selectively placed in operating series electrical circuit relationship with the respective conductor wires by a respective selector switch connected between each respective voltage limiting resistor and the constant current power supply terminal with the settings of the selector switches being automatically controlled by said control computer whereby any particular desired value voltage limiting resistor may be selectively connected in series circuit relationship with the respective electrical conductors by selective operation of the respective selector switches automatically by the control computer pursuant to a desired program to thereby control the value of the electric potential supplied to the grid-like array of conductive wires.

17. A testing system according to claim 14 further including a second grid-like array of conductive wires lying in the same plane and spaced apart from the item under test on the side thereof opposite the first mentioned grid-like array of conductive wires and with said means for selectively measuring the voltage drop across the electro-luminescent plasma being responsive to the plasma produced between either of the respective grid-like arrays of conductive wires and the item under test or both.

18. A testing system according to claim 16 further including a second grid-like array of conductive wires lying in the same plane and spaced apart from the item under test on the side thereof opposite the first mentioned grid-like array of conductive wires and with said means for selectively measuring the voltage drop across the electro-luminescent plasma being responsive to the plasma produced between either of the respective grid-like arrays of conductive wires and the item under test or both.

19. A testing system according to claim 18 further including a commonly connected, conductive wire grid-like array excitation potential switching means connected in series circuit relationship between the constant current source of electric potential and both grid-like arrays of conductive wires for selectively controlling the application of excitation electric potential to either one or both grid-like arrays from said constant current source of potential with said commonly connected switching means being controlled by said control computer.

20. An electro-optical testing system according to claim 14 wherein the top of the gastight chamber is transparent and the conductor wires comprising the grid-like array of conductive wires are spaced-apart a sufficient distance between each other within the planar array and are sufficiently fine in cross section so that the array is substantially transparent and readily may be visually seen through and further including at least one electro-optical scanning photometer detector viewing the item under test through the transparent top of the gastight chamber for scanning light areas on the surface of the item under test and deriving output electric signals representative of characteristic electro-optical light patterns produced by the item under test for each setting of the movable probe.

21. An electro-optical testing system according to claim 19 wherein the top and bottom of the gastight chamber are transparent and the conductor wires comprising the grid-like arrays of conductive wires are spaced-apart a sufficient distance between each other within the planar array and are sufficiently fine in cross section so that the array is substantially transparent and readily may be visually seen through and further including respective electro-optical scanning photometer detectors viewing the upper and lower surfaces of the item under test through the respective transparent top and bottom of the gastight chamber for scanning light areas on the upper and lower surfaces of the item under test and deriving output electric signals representative of characteristic electro-optical patterns produced on the item under test for each setting of the movable probe.

22. A method of testing conductivity characteristics of ceramic substrates, and printed circuit boards which have electrically conductive interconnected parts, pads, pathways, vias and their conductive surfaces for the existence of discontinuities (breaks), undesired conductive areas (shorts) or other irregularities in size or shape using a testing system employing an electro-luminescent plasma produced in a gaseous atmosphere contained within a sealable, substantially gastight test chamber within which an item under test is supported; the testing system further including a grid-like array of parallel conductor wires lying in substantially the same plane and arrayed within the sealable chamber over an item under test and spaced apart therefrom, and movable probe means for contacting selected test points on an item under test to produce an excitation electric field across the gaseous atmosphere and induce the formation of electro-luminescent plasma therein; said method comprising:

introducing an item to be tested into the interior of the test chamber and sealing it closed in a substantially gastight manner;

introducing a gaseous atmosphere capable of electro-luminescence at low pressure into the interior of the test chamber along with the item under test;

coupling one terminal of a constant current source of excitation electric potential with the movable probe means to selected test points located within an x-y plane on the surface of a item under test;

coupling an opposite polarity potential terminal of the variably controlled constant current source of electric potential to the grid-like array of parallel conductor wires whereby electro-luminescent plasma is produced within the chamber around the test points contacted by the movable probe means and around all conductive points on the item under test having electrical continuity therewith which are exposed to the gaseous atmosphere; and measuring differences in voltage drop produced across the electro-luminescent plasma for respective settings of the movable probe means for comparison to a standard and use as a measure of the continuity and other electrical conductivity characteristics of the item under test.

23. A testing method according to claim 22 wherein the grid-like array of conductive wires is comprised by a plurality of individual, spaced-apart, parallel, extremely fine exposed conductors whose conductive surfaces are directly contacted by the gaseous atmosphere with all of the conductors in the array lying within the same plane that is substantially parallel with the planar surface of an item under test with all the conductors in the array and being maintained at substantially the same electrical potential and wherein each individual conductor in the array is connected in series electrical circuit relationship with at least one respective voltage limiting resistor that is physically located outside the sealable gastight chamber.

24. A method system according to claim 23 wherein each individual conductor wire is suitably connected in series electrical circuit relationship with a plurality of different value voltage limiting resistors that are selectively placed in operating series electrical circuit relationship with the respective conductor wires by a respective selector switch connected between each respective voltage limiting resistor and the constant current power supply terminal whereby any particular desired value voltage limiting resistor may be selectively connected in series circuit relationship with the respective electrical conductors by selective operation of the respective selector switches to thereby control the value of the electric potential supplied to the array of conductive wires.

25. A testing method according to claim 22 further including a second grid-like array of conductive wires lying in the same plane and spaced apart from the item under test on the side thereof opposite the first mentioned grid-like array of conductive wires and with said means for selectively measuring the voltage drop across the electro-luminescent plasma being responsive to the plasma produced between either of respective grid-like arrays of conductive wires and the item under test or both.

26. A testing method according to claim 24 further including a second grid-like array of conductive wires lying in the same plane and spaced apart from the item under test on the side thereof opposite the first mentioned grid-like array of conductive wires and with the means for selectively measuring the voltage drop across the electro-luminescent plasma being responsive to the plasma produced between either of the respective grid-like arrays of conductive wires and the item under test or both.

27. A testing method according to claim 25 further including commonly connected, conductive wire grid-like array excitation potential switching means connected in series circuit relationship between the constant current source of electric potential and both grid-like arrays of conductive wires for selectively controlling the application of excitation electric potential to either one or both grid-like arrays from said constant current source of potential.

28. A testing method according to claim 26 further including commonly connected, conductive wire grid-like array excitation potential switching means connected in series circuit relationship between the constant current source of electric potential and both grid-like arrays of conductive wires for selectively controlling the application of excitation electric potential to either one or both grid-like arrays from said constant current source of potential.

29. An electro-optical testing method according to claim 22 wherein the top of the gastight chamber is transparent and the conductor wires comprising the grid-like array of conductive wires are spaced-apart a sufficient distance between each other within the planar array and are sufficiently fine in cross section so that the array is substantially transparent and readily may be visually seen through and further including at least one electro-optical viewing instrument for viewing the item under test through the transparent top of the gastight chamber for scanning light areas on the surface of the item under test and deriving output electric signals representative of characteristic electro-optical light patterns produced by the item under test for each setting of the movable probe.

30. An electro-optical testing method according to claim 28 wherein the top and bottom of the gastight chamber are transparent and the conductor wires comprising the grid-like arrays of conductive wires are spaced-apart a sufficient distance between each other within the planar array and are sufficiently fine in cross section so that the array is substantially transparent and readily may be visually seen through and further including respective electro-optical viewing instruments viewing upper and lower surfaces of the item under test through the respective transparent top and bottom of the gastight chamber for scanning light areas on the upper and lower surfaces of the item under test and deriving output electric signals representative of characteristic electro-optical patterns produced by the item under test for each setting of the movable probe.

31. A testing method according to claim 22 further including a central control computer having a display for automatically controlling operation of the sealable gastight chamber including automatic purging and recharging of the ionizable gas after placement of a new item to be tested in the gastight chamber, automatic positioning of the movable probe and selective energization of the grid-like array of conductive wires from the variably controlled constant current source of electric potential at a preselected current setting, said control computer being responsive to the measuring means for automatically deriving an indication of the electro-luminescent plasma resistance at each movable probe setting pursuant to the relation Plasma Resistance equals the Voltage supplied by the source of electric potential divided by the Current for comparison to a standard resistance value for the setting stored in the computer and for deriving an automatic output indication of the conductivity characteristics of the item under test.

32. A testing method according to claim 27 further including a central control computer having a display for automatically controlling operation of the sealable gastight chamber including automatic purging and recharging of the ionizable gas after placement of a new item to be tested in the gastight chamber, automatic positioning of the movable probe, automatic switching of the commonly connected conductive grid-like array selector switch to selectively energize either the upper or lower grid-like array of conductors, or both, and automatic energization of the selected grid-like array of conductive wires from the variably controlled constant current source of electric potential at a preselected current setting, said control computer being responsive to the measuring means for automatically deriving an indication of the electroluminescent plasma resistance at each movable probe setting pursuant to the relation Plasma Resistance equal the Voltage supplied by the source of electric potential divided by the Current for comparison to a standard resistance value for the setting stored in the computer and deriving an automatic output indication of the conductivity characteristics of the item under test.

33. A combined electrical and electro-optical testing method according to claim 29 further including a central control computer having a display for automatically controlling operation of the sealable gastight chamber including automatic purging and recharging of the ionizable gas after placement of a new item to be tested in the gastight chamber, automatic positioning of the movable probe and selective energization of the grid-like array of conductive wires from the variably controlled constant current source of electric potential at a preselected current setting, said control computer being responsive to the measuring means for automatically deriving an indication of the electroluminescent plasma resistance at each movable probe setting pursuant to the relation Plasma Resistance equal the Voltage supplied by the source of electric potential divided by the Current for comparison to a standard resistance value for the setting stored in the computer and deriving an automatic output indication of the conductivity characteristics of the item under test; and said control computer being further responsive to the output from the electro-optical viewing instrument for comparing the output electric signals characteristic of the electro-optical light patterns produced at a preselected movable probe setting to thereby derive an output indication of the conformity of the light pattern to a prestored pattern as a further measure of the conductivity characteristics of the item under test.

34. A combined dual sided electrical and electro-optical testing method according to claim 30 further including a central control computer having a display for automatically controlling operation of the sealable gastight chamber including automatic purging and recharging of the ionizable gas after placement of a new item to be tested in the gastight chamber, automatic positioning of the movable probe, automatic switching of the commonly connected conductive grid-like array selector switch to selectively energize either the upper or lower grid-like arrays of conductors, or both, and automatic energization of the selected grid-like array of conductive wires from the variably controlled constant current source of electric potential at a preselected current setting, said control computer being responsive to the measuring means for automatically deriving an indication of the electro-luminescent plasma resistance at each movable probe setting pursuant to the relation Plasma Resistance equal the Voltage supplied by the source of electric potential divided by the Current for comparison to a standard resistance value for the setting stored in the computer and deriving an automatic output indication of the conductivity characteristics of the item under test; and said control computer being further responsive to the output from either the upper or lower electro-optical viewing instrument or both for comparing the output electric signals characteristic of the electro-optical light patterns to a preselected standard pattern stored in the control computer for the selected movable probe setting to thereby derive an output indication of the conformity of the light patterns to a prestored pattern as a further measure of the conductivity characteristics of the item under test.

* * * * *